United States Patent
Mucenieks et al.

[11] Patent Number: 6,111,462
[45] Date of Patent: Aug. 29, 2000

[54] RF POWER AMPLIFIER LINEARIZATION USING PARALLEL RF POWER AMPLIFIERS HAVING INTERMOD-COMPLEMENTING PREDISTORTION PATHS

[76] Inventors: Lance T. Mucenieks, 200 Riverview Dr., Boulder Creek, Calif. 95006; Charles S. Robertson, 983-1 Belmont Ter., Sunnyvale, Calif. 94014; Brent L. Irvine, 3089 Teal Ridge Ct., San Jose, Calif. 95136; Nemy Salvador, 4320 Verdigras Cir., San Jose, Calif. 95134

[21] Appl. No.: 09/195,536

[22] Filed: Nov. 18, 1998

[51] Int. Cl.[7] ...................................................... H03F 1/26
[52] U.S. Cl. ........................................... 330/149; 330/151
[58] Field of Search .................................... 330/149, 151, 330/52

[56] References Cited

U.S. PATENT DOCUMENTS

| | | | |
|---|---|---|---|
| 4,879,519 | 11/1989 | Myer | 330/149 |
| 5,363,056 | 11/1994 | Blauvelt | 330/118 |
| 5,386,198 | 1/1995 | Ripstrand et al. | 330/52 |
| 5,489,875 | 2/1996 | Carers | 330/151 |
| 5,528,196 | 6/1996 | Baskin et al. | 330/151 |
| 5,570,063 | 10/1996 | Eisenberg | 330/149 |
| 5,594,385 | 1/1997 | Anvari | 330/149 |
| 5,606,286 | 2/1997 | Bains | 330/149 |
| 5,617,061 | 4/1997 | Fukuchi | 330/151 |
| 5,619,168 | 4/1997 | Myer | 330/149 |
| 5,623,227 | 4/1997 | Everline et al. | 330/2 |
| 5,760,646 | 6/1998 | Belcher et al. | 330/149 |
| 5,768,699 | 6/1998 | Behan et al. | 330/151 |
| 5,770,971 | 6/1998 | McNicol | 330/52 |
| 5,774,018 | 6/1998 | Gianfortune et al. | 330/52 |
| 5,789,976 | 8/1998 | Ghannouchi et al. | 330/52 |
| 5,912,586 | 6/1999 | Mitzlaff | 330/151 |

OTHER PUBLICATIONS

"Feedforward—an alternative Approach to Amplifier Linearization," by T.J. Bennett and R.F. Clements, The Radio And Electronic Engineer, vol. 44, No. 5, May 1974, pp. 257–262.

*Primary Examiner*—Robert Pascal
*Assistant Examiner*—Khanh Van Nguyen
*Attorney, Agent, or Firm*—Charles E Wands

[57] ABSTRACT

An RF power amplifier linearization architecture has a pair of matched RF amplifiers, RF signal paths through which are intercoupled with a phase and amplitude measurement and predistortion mechanism. By selectively combining the RF output of a main path RF power amplifier with the RF input signal supplied to a parallel path RF power amplifier, the predistortion control mechanism of the invention predistorts the RF input signal applied to the parallel path amplifier, so that it includes the same modulated RF carrier component as that applied to the main path amplifier, as well as a complementary version of the intermodulation component of the output of the main path amplifier. The predistortion for each amplifier is controlled such that the resulting RF output signals produced by the matched amplifier pair will have the desired RF carrier modulation component but equal amplitude and phase-reversed intermodulation components. Combining these two matched amplifier outputs in a quadrature hybrid produces a composite signal, in which the desired amplified modulated RF carrier components produced by each matched amplifier constructively sum, while unwanted IMD components cancel.

24 Claims, 3 Drawing Sheets

RF POWER AMPLIFIER LINEARIZATION USING PARALLEL RF POWER AMPLIFIERS HAVING INTERMOD-COMPLEMENTING PREDISTORTION PATHS

FIELD OF THE INVENTION

The present invention relates in general to communication systems, and is particularly directed to an RF power amplifier linearization mechanism, that employs a pair of RF amplifiers, RF signal paths through which are intercoupled with a phase and amplitude measurement and predistortion mechanism that is effective to cancel intermodulation products in a composite amplified RF signal derived from both RF power amplifiers.

BACKGROUND OF THE INVENTION

Communication services providers are subject to very strict bandwidth usage spectrum constraints, such as technically mandated specifications and regulations imposed by the Federal Communications Commission (FCC), which requires that sideband spillage, namely the amount of energy spillover outside a licensed band of interest, be sharply attenuated (e.g., on the order of 50 dB). While such limitations are adequate for traditional forms of modulation such as FM, they are difficult to achieve using more contemporary, digitally based modulation formats, such as M-ary modulation. Attenuating the sidebands sufficiently to meet industry or regulatory-based requirements using such modulation techniques requires very linear signal processing systems and components. Although linear components can be implemented at a reasonable cost at relatively low bandwidths (baseband) of telephone networks, linearizing such components, in particular power amplifiers, at RF frequencies becomes a very costly exercise.

A fundamental problem is the fact that RF power amplifiers are inherently non-linear devices, and generate unwanted intermodulation distortion products (IMDs), which manifest themselves as spurious signals in the amplified RF output signal, separate and distinct from the RF input signal. A further source of RF amplifier distortion is the presence of spectral regrowth or spreading of a compact spectrum into spectral regions that do not appear in the RF input signal. The distortion introduced by an RF amplifier causes the phase and amplitude of its amplified RF output signal to depart from the respective phase and amplitude of the RF input signal, and may be considered as an incidental (and undesired) amplifier-sourced modulation of the input signal.

One brute force approach to linearize an RF power amplifier is to build the amplifier as large, high power device, and then operate the amplifier at a low power level, that is only a small percentage of its rated output power, where the RF amplifier's transfer function is relatively linear. An obvious drawback to this approach is the overkill penalty—a high cost and large sized RF amplifier.

Other prior art techniques include post-amplification feed forward correction, and pre-amplification, pre-distortion correction. In accordance with the former approach, error (distortion) present in the RF amplifier's output signal is extracted, amplified to the proper level, and then reinjected (as a complement of the error signal back) into the output path of the amplifier, such that (ideally) the RF amplifier's distortion is effectively canceled. In the second approach, a predistortion signal is injected into the RF input signal path upstream of the RF amplifier. The predistortion signal has a characteristic that has been predetermined to be ideally equal and opposite to the distortion expected at the output of the high power RF amplifier, so that when subjected to the transfer function of the RF amplifier, it should effectively cancel its anticipated distortion behavior. The predistortion mechanism may be made adaptive by extracting the error signal component in the output of the RF amplifier and adjusting the predistortion signal in accordance with the such extracted error behavior of the RF amplifier during real time operation, so as to effectively continuously minimize distortion in the amplifier's output.

SUMMARY OF THE INVENTION

In accordance with the present invention, amplifier linearization is achieved by a parallel path arrangement of matched RF power amplifiers. The RF input and output paths of the matched amplifier pair are selectively interconnected through a phase and amplitude measurement and predistortion mechanism, that is effective to cancel intermodulation distortion (IMD) products in a composite amplified RF signal derived from both RF power amplifiers. As will be described, this predistortion control mechanism predistorts the RF input signal applied to one of the matched RF power amplifiers, so that it includes the same modulated RF carrier component as that applied to the other RF power amplifier, as well as a complementary version of the intermodulation component of the output of the main path amplifier. The RF output signals produced by the matched amplifier pair have the desired RF carrier modulation component but equal amplitude and phase-reversed intermod components. Combining these two matched amplifier outputs in a quadrature hybrid produces a composite signal, in which the desired amplified modulated RF carrier components produced by each matched amplifier constructively sum to the intended amplification level, while unwanted IMD components cancel, leaving only the desired amplified modulated RF carrier.

At its front end, the amplifier linearization architecture of the invention splits an RF input signal into respective 'main' and 'parallel' paths for the two matched amplifiers. Each path includes variable attenuator and phase shift devices that are controlled by a power minimization loop controller, which serves to extract distortion energy from the main path and minimize or null intermodulation product distortion (IMD) energy in the composite RF output signal. IMD energy in the amplified RF carrier output may be directly measured using a distortion detector or correlator, or the power minimization loop controller may rely on an upstream extraction of IMD energy and the close tracking between the main and error paths due to use of matched and balanced components.

A measure of IMD distortion per se is derived from the output of a carrier cancellation combiner, installed upstream of the parallel path amplifier. The carrier cancellation combiner extracts the IMD portion of the output of the main path RF amplifier, by subtracting the split amplified RF output signal from the main path amplifier from the split RF input signal applied to the parallel path amplifier. This leaves a substantially reduced magnitude (ideally nulled) carrier component and a dominant complementary phase IMD component.

The complementary phase intermod component is summed in a carrier-IMD combiner with the parallel path-split RF input signal to provide a desired composite RF input signal to be predistorted and applied to the parallel path amplifier. The predistortion parameters may be controlled by the power minimization loop controller to set by adjusting the level of the input signal sample relative to the level of the complementary IMD input component to the parallel path RF amplifier, so that half of the IMD distortion is canceled within the parallel RF amplifier. The remaining half of the IMD component cancels the main path distortion in the quadrature hybrid to which the output of each matched amplifier is applied.

Being matched with the main path amplifier, the parallel path RF amplifier operates on its composite RF input signal in the same manner as the main path RF amplifier operates on its RF input signal. Since the RF input signal to the parallel path amplifier contains the RF input signal amplified by the main path amplifier, then absent any other component in its input signal, its RF output signal would be substantially identical to the RF output signal produced by RF amplifier. However, since the input signal to the parallel path RF amplifier contains a phase-inverted version of the IMD component extracted by the carrier cancellation combiner, the RF output signal produced by the parallel path RF amplifier includes the desired modulated RF carrier, an unwanted IMD component associated with the desired carrier, and an amplified version of the phase-inverted IMD component that is aligned with and of a larger amplitude than the unwanted IMD component.

The resultant RF output of the parallel path amplifier therefore contains the desired modulated RF carrier component that is aligned with the desired modulated RF carrier component in the RF output of the main path amplifier, and a phase-inverted IMD component that is aligned with and of the same amplitude as the unwanted IMD component produced by the main path amplifier. These two RF output signals are combined in the quadrature hybrid to produce a composite signal, in which the desired amplified modulated RF carrier components produced by each amplifier constructively sum to the intended amplification level, while the unwanted IMD components cancel.

DETAILED DESCRIPTION

Figure 1:
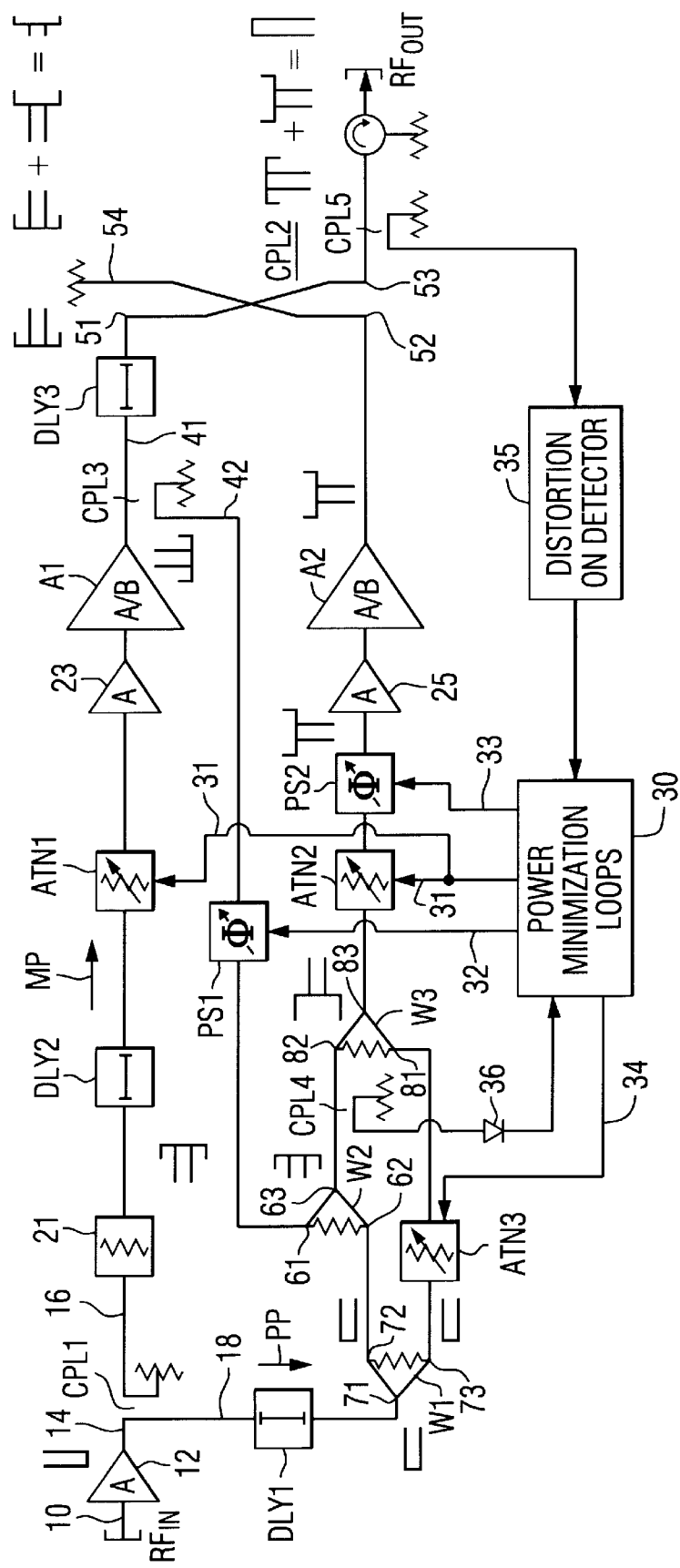
FIG. 1 diagrammatically illustrates an RF power amplifier linearization mechanism in accordance with a first embodiment of the invention, that employs a distortion detector of the type described in U.S. Pat. No. 5,789,927.

Before describing in detail the new and improved parallel RF power amplifier-based linearization mechanism in accordance with the present invention, it should be observed that the invention resides primarily in what is effectively a prescribed arrangement of conventional RF communication circuits and associated digital signal processing components and attendant supervisory control circuitry, that controls the operations of such circuits and components. Consequently, the configuration of such circuits components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein.

Thus, the block diagram illustrations are primarily intended to show the major components of a parallel RF amplifier distortion correction system in a convenient functional grouping, whereby the present invention may be more readily understood. In addition, to facilitate an understanding of signal processing flow through the respective paths of the linearization system of the various embodiments of the invention, reduced complexity spectral diagrams of the desired modulated RF carrier and the unwanted IMD components have been placed throughout the Figures in association with respective transfer functions of the system components.

Referring now to FIG. 1, a first embodiment of the RF power amplifier linearization mechanism of the present invention is diagrammatically illustrated as comprising an input terminal 10 to which an RF input signal $RF_{IN}$ to be amplified is applied. The RF input signal is coupled through a first buffer amplifier 12 to an input port 14 of a directional coupler CPL1. The directional coupler CPL1 serves to split the RF input signal into two paths. The split RF input signal in one of these paths, hereinafter termed the main path as shown by the arrow MP, is adjusted in amplitude and phase and then amplified by a first of a pair of matched RF power amplifiers A1 and A2. The split RF input signal in a second of these paths, hereinafter termed the parallel path as shown by the arrow PP, is used to construct a signal consisting of both of the original RF input signal, to be amplified by the second RF power amplifier A2, and a complementary version of the IMD products that each of the two matched RF amplifiers A1 and A2 inherently introduce. Having matched RF amplifiers implies that devices A1 and A2 have the same transfer functions—both in terms of their intended RF performance and unwanted IMD components they inherently introduce into the amplified outputs.

As will be described, as a result of selectively combining the RF (carrier and intermod) output of the main path RF power amplifier A1 with the RF input signal in the other (parallel) split path, the predistorted RF input signal applied to the matched amplifier A2 in the parallel path can be made to include the same modulated RF carrier component as that applied to the main path amplifier A1. In addition, this predistorted RF input signal to the amplifier A2 will contain a complementary version of the intermodulation component of the output of the main path amplifier A1. Moreover, the predistortion for each amplifier is such that the resulting RF output signal produced by the matched amplifier A2 will have the desired RF carrier modulation component aligned with that of the main path amplifier A1, but its undesired intermod component of equal amplitude and phase-reversed with respect to the undesired intermod component of the RF output of the main path amplifier A1. Combining these two matched amplifier outputs in the quadrature hybrid CPL2 produces a composite signal, in which the desired amplified modulated RF carrier components produced by each matched amplifier constructively sum to the intended amplification level, while unwanted IMD components destructively combine or cancel, leaving only the desired amplified modulated RF carrier.

The first split path from the RF input signal splitting directional coupler CPL1 is derived from a first output port 16, which is coupled through a first attenuator pad 21 and a delay trimmer DLY2 to a main path-installed predistortion variable attenuator ATN1. Attenuator pad 21 provides a prescribed amount of attenuation (e.g., 6 dB) of the main path split RF input signal, in order to balance the output extracted portion of the RF input signal at a second output 18 of the input signal splitting directional coupler CPL1. The delay trimmer DLY2 serves to equalize the propagation delay through the main signal path of the first RF power amplifier A1 with that through the parallel path consisting of DLY1, W1, and W2.

The variable attenuator ATN1 is operative to adjust the amplitude of the signal entering A1, in accordance with a main path amplitude control signal, that is supplied over link 31 from a power minimization loop controller 30. This controller adjusts both ATN1 and PS1 to minimize the power detected at the coupled port of CPL4 by detector 36, and thereby cancels the carrier component of the signal entering W2 at port 61. Via a distortion detector 35 coupled via directional coupler CPL5 to the output port 53 of quadrature hybrid CPL2, the power minimization loop controller 30 is also provided with a measure of distortion energy that may be present in the composite RF output signal derived from the main path RF power amplifier A1 and the parallel path RF power amplifier A2. Controller 30 minimizes this distortion energy measurement by adjusting ATN2 and PS2, the amplitude and phase distortion control elements installed parallel RF amplifier path to reduce (minimize/null) the distortion energy.

As a non-limiting example, power minimization loop controller 30 may be implemented using an amplitude and phase predistortion mechanism of the type described in the U.S. Pat. No. 5,742,201, to J. Eisenberg et al, entitled: "Polar Envelope Correction Mechanism For Enhancing Linearity Of RF/Microwave Power Amplifier," issued Apr. 21, 1998, assigned to the assignee of the present application and the disclosure of which is incorporated herein. Distortion detector 35 may be implemented using a distortion measurement mechanism of the type described in the U.S. Pat. No. 5,789,927 to D. Belcher, entitled: "Baseband Measurement OF RF Power Amplifier Distortion," issued Aug. 4, 1998, assigned to the assignee of the present application and the disclosure of which is incorporated herein.

The controllably attenuated RF input signal produced by the variable attenuator ATN1 is coupled through a buffer amplifier 23 to the main path RF power amplifier A1, wherein the amplitude-adjusted input RF input signal of the main path MP is amplified (and subjected to the inherent amplitude and phase distortion of the RF power amplifier). The amplified RF output produced by the main path power amplifier A1 is coupled to two RF output paths. A first RF output path is supplied from a first output port 41 of a directional coupler CPL3, that is installed in the amplified RF output path of the RF power amplifier A1, through a delay line DLY3 to a first input port 51 of quadrature hybrid CPL2. As pointed out above, the quadrature hybrid CPL2 has a second signal input port 52 coupled to receive the amplified output of the parallel path power amplifier A2, and produces a composite amplified RF output signal at its output port 53.

The second RF output path from the main path RF amplifier A1 is coupled from the second output port 42 of the directional coupler CPL3 to a variable phase shifter PS1. Variable phase shifter PS1 is operative to impart a prescribed amount of phase shift to the second split path portion of the amplified RF output of the main path RF amplifier A1, in accordance with a phase shift control signal that is supplied over link 32 from power minimization loop controller 30.

This PS1-phase adjusted signal is then applied to a first input port 61 of an RF carrier cancellation combiner W2, which may be configured as a Wilkinson combiner, as shown. RF carrier cancellation combiner W2 is used to extract the IMD portion of the output of the RF amplifier A1, by subtracting the split RF output signal from the main path amplifier A1 (derived by the second RF output path from the second output port 42 of the directional coupler CPL3) from the split RF input signal in the parallel path PP derived from the second port 18 of the directional coupler CPL1.

For this purpose, a second input port 62 of the carrier cancellation combiner W2 is coupled to a first output port 72 of a parallel path-installed Wilkinson splitter W1, the input port 71 of which is coupled via a delay line DLY1 to a second output port 18 of the directional coupler CPL1. The delay line DLY1 serves to equalize the propagation delay of the RF input signal through the parallel path from the second output port 18 of the directional coupler CPL1 for ensuring proper phase alignment of the signals applied to the two input ports 61 and 62 of the carrier cancellation combiner W2. However, if the main path delay is short, or the bandwidth of the input RF signal is relatively narrow, adequate carrier cancellation by combiner W2 can be achieved without delay line DLY1. Proper phase alignment of the carrier output signals from the amplifiers A1 and A2 at the quadrature hybrid CPL2 can be obtained over frequency by simply adding a short delay DLY2 in the main path.

The differential signal combining functionality of combiner W2 leaves a substantially reduced magnitude carrier component and a dominant inverted IMD component at combiner output port 63. While complete carrier cancellation in combiner W2 is not required for proper operation of the system, minimizing the detected power extracted by the directional coupler CPL4 to the power minimization loop controller 30 provides a relatively inexpensive method to maintain constant main path gain, while preserving the requisite out-of-phase condition of the IMD component relative to the carrier component at combiner W3.

As described briefly above, the intended functionality of selectively combining the RF (carrier and intermod) output of the main path RF power amplifier A1 with the split RF input signal in the parallel path is to produce a predistorted RF input signal to the matched amplifier A2 that includes the same modulated RF carrier input component as that applied to the main path amplifier A1, and also a complementary version of the intermodulation component of the output of the main path amplifier A1.

Figure 3:
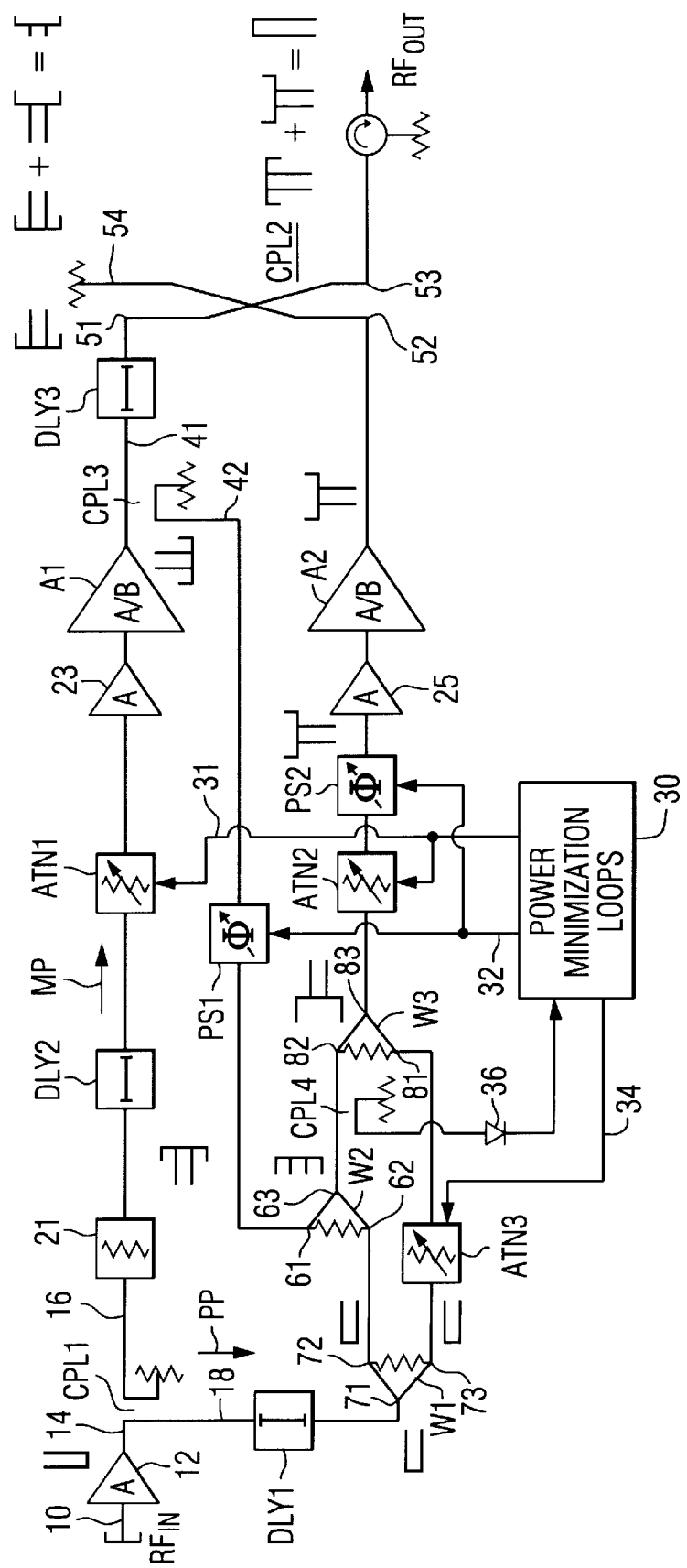
FIG. 3 diagrammatically illustrates an RF power amplifier linearization mechanism in accordance with a third embodiment of the invention.

For this purpose, the complementary intermod component of the desired composite RF input signal to the parallel path amplifier A2 is obtained by coupling the output port 63 of the RF carrier cancellation combiner W2 through a directional coupler CPL4 to a first input port 81 of a carrier-IMD combiner W3. These gain and phase adjuster settings for ATN1 and PS1 which result in carrier cancellation in W2 can also be used for ATN2 and PS2 (as shown in FIG. 3) to cancel the distortion energy from A1 and A2 at CPL2. The RF input component of the composite RF input signal to the parallel path amplifier A2 is obtained by coupling a second output port 73 of the Wilkinson splitter W1 through an adjustable attenuator ATN3 to a second input port 81 of carrier-IMD combiner W3. The adjustable attenuator ATN3 is controlled by a control line 34 from loop controller 30 so as to insert attenuation into the parallel path PP of the input RF signal extracted by the directional coupler CPL1, such that carrier to intermodulation distortion ratio (C/I) at the output of carrier-IMD combiner W3 will be approximately 6 dB less than that at the output of the main path amplifier A1, assuming A1 and A2 are identical amplifiers. For the case where A2 and A1 are scaled versions of one another (but still have identical transfer functions) the C/I ratio and the coupling coefficient of CPL2 will change to provide carrier cancellation at port 54 and IMD cancellation at port 53 of CPL2. For the case where parallel path amplifier A2 is three times larger than amplifier A1, CPL2 will be a 6 dB coupler and the C/I ration at W3 will be about 4 dB less than the output of main amplifier A1.

The output 83 of carrier-IMD combiner W3 is coupled through a parallel path variable attenuator ATN2 and a variable phase shifter PS2, which introduce respective amounts of attenuation and phase shift to the parallel path out-of-phase carrier/IMD signal supplied to the parallel path RF amplifier A2, in accordance with attenuation and phase shift control signals supplied from power minimization loop controller 30. Parallel path variable attenuator ATN2 is controlled in concert with main path variable attenuator ATN1 via control line 31, while parallel path phase shifter PS2 is controlled via a control line 33.

Figure 2:
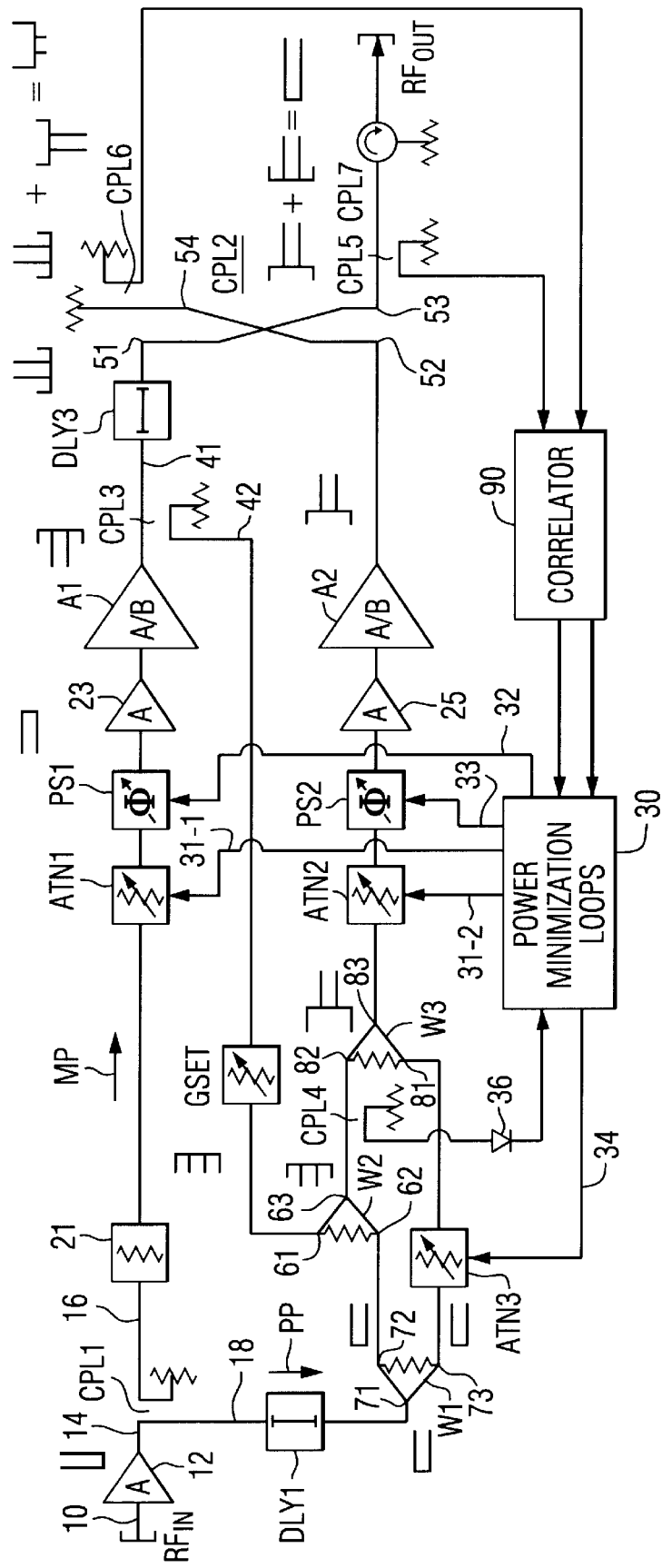
FIG. 2 diagrammatically illustrates an RF power amplifier linearization mechanism in accordance with a second embodiment of the invention, that employs an auto-calibrating correlator of the type described in co-pending U.S. patent application Ser. No. 09/026,925, now U.S. Pat. No. 5,929,704, issued Jul. 27, 1999.

Using standard error minimization (e.g., power or least mean squared minimization) processing, the amount of attenuation and phase shift distortion for the variable attenuators ATN1, ATN2 and variable phase shift elements PS1, PS2 provided by power minimization loop controller 30 are controlled, so as to minimize the power at the output of carrier cancellation combiner W2 and to minimize the IMD power detected by the distortion detector 35 in FIG. 2.

As a non-limiting example, these parameters may be controlled to set the level of the complementary IMD input component to the parallel path RF amplifier A2, so that half of the IMD distortion is canceled within the RF amplifier A2. The remaining half is canceled by the main path distortion summed in the quadrature hybrid CPL2. This predistortion parallel path RF input signal (which includes both a predistorted version of the desired RF input component applied to the RF input port 10, as well as a predistorted version of the complementary phase IMD component extracted by carrier cancellation combiner W2) is coupled through a buffer amplifier 25 to the parallel path RF power amplifier A2.

As noted above, since it is matched with the main path amplifier A1, the parallel path RF amplifier A2 will operate on its RF input signal in the same manner as the main path RF amplifier A1 operates on its RF input signal. Since the RF input signal to the parallel path amplifier A2 contains the RF input signal amplified by the main path amplifier A1, absent any other component in its input signal, its RF output signal would be substantially identical to the RF output signal produced by RF amplifier A1. As described previously, this output includes the desired amplified modulated RF carrier and an unwanted IMD component.

However, because the input signal to the parallel path RF amplifier A2 contains a phase-inverted version of this IMD component (as extracted by the carrier cancellation combiner W2), the RF output signal produced by RF amplifier A2 will include the desired modulated RF carrier, an unwanted IMD component associated with the desired carrier, and an amplified version of the phase-inverted IMD component that is aligned with and of a larger amplitude than the unwanted IMD component. The resultant RF output of the RF amplifier A2 therefore contains the desired modulated RF carrier component that is aligned with the desired modulated RF carrier component in the RF output of the amplifier A1, and a phase-inverted IMD component that is aligned with and of the same amplitude as the unwanted IMD component produced by the amplifier A1.

These two RF output signals are combined in the quadrature hybrid CPL2 to produce a composite signal in which the desired amplified modulated RF carrier components produced by each amplifier constructively sum to the intended amplification level, while the unwanted IMD components destructively combine or cancel, leaving only the desired modulated RF carrier signal. It should be noted that proper phase alignment of the RF output signals produced by amplifiers A1 and A2 is readily achieved by minimizing carrier power at the termination port 54 of the quadrature hybrid CPL2, or minimizing distortion energy detected at the output via directional coupler CPL5.

A principal benefit of the parallel amplifier predistortion approach described above is the fact that it does not suffer from stability issues, and does not require the fast loops and associated delays associated with PEC. This provides improved performance and wider bandwidth correction than PEC, and at lower cost. Eliminating the main path delay line and error amplifier used in conventional feedforward amplifiers reduces cost and RF power losses downstream of the main RF amplifier, thereby improving amplifier efficiency. In addition, the predistortion scheme described above takes into account all non-linear effects, including self-heating, video bandwidth limitations, etc., which memory-less AM-AM and AM-PM compensation (work function distortion) does not.

A second embodiment of the RF power amplifier linearization mechanism of the present invention, which employs a correlator as part of the IMD error measurement input to the loop minimization controller is diagrammatically illustrated in FIG. 2. Since, for the most part, the signal processing paths and components are the same as those of the embodiment of FIG. 1, the description of FIG. 2 will focus upon the differences between the two embodiments.

More particularly, in the embodiment of FIG. 2, the main path delay line DLY2 at the output of attenuator pad 21 in the embodiment of FIG. 1 is removed, and the variable phase shifter PS1 is moved from the carrier cancellation path from the output of the main path RF power amplifier A1 and is installed instead in the main path upstream of the power RF amplifier A1 together with the adjustable attenuator ATN1. The carrier cancellation path from the output 42 of the directional coupler CPL3 and the input 61 of the carrier cancellation combiner W2 now goes through a variable gain setting attenuator GSET. Also respective attenuators ATN1 and ATN2 are controlled by dedicated lines 31-1 and 31-2.

In addition, in the second embodiment, the distortion detector 35 of the first embodiment is replaced by a correlator 90, respective inputs 91 and 92 of which are coupled to the output port 53 of the quadrature hybrid CPL2 via directional coupler CPL5, and the output of a directional coupler CPL6, which is ported to quadrature hybrid termination port 54. As a non-limiting but preferred example, correlator 90 may be implemented as an auto-calibrating correlator of the type described in co-pending U.S. patent application Ser. No. 09/026,925, filed Feb. 20, 1998, by J. Proctor et al, entitled: "Control Of RF Error Extraction Using Auto-Calibrating RF Correlator," U.S. Pat. No. 5,929,704, issued Jul. 27, 1999, assigned to the assignee of the present application and the disclosure of which is incorporated herein.

As described previously, the phase and amplitude adjustments installed in the main and parallel RF signal propagation paths of the linearization system of the invention are controlled by the power minimization loop controller 30 such that energy in the IMD components generated at the outputs of the main path RF amplifier A1 and the parallel path RF amplifier A2 cancel each other at the output of the quadrature hybrid CPL2, while the desired carrier components constructively add. This means that the energy sampled by the directional coupler CPL5 at the output port 53 of the quadrature hybrid CPL2 will consist almost entirely of carrier signal.

On the other hand, the energy sampled by the directional coupler CPL6 at the termination port 54 of the quadrature hybrid CPL2 will consist almost entirely of IMD signal, as the IMD signals add constructively at this point, whereas the carrier signals cancel each other. If there is any correlation of the energy in the carrier signals sampled by directional couplers CPL5 and CPL6, correlator 90 will produce an error signal. This error signal is employed by the power minimization loop controller 30 to generate a control signal for phase shifter PS2 and variable attenuator ATN2 in the parallel path, so as to drive the carrier energy at the termination port 54 of the quadrature hybrid to zero. This error signal can also be used to adjust the variable attenuator ATN3, to establish the requisite C/I ratio, to simultaneously predistort the input to parallel path RF amplifier A2 and cancel the distortion from main path RF amplifier A1 at the output port 53 of quadrature hybrid CPL2.

A third embodiment of the RF power amplifier linearization mechanism of the present invention is shown diagrammatically in FIG. 3. This third embodiment is substantially the same as that of FIG. 1, except for the manner in which the power minimization loop controller 30 derives a measure of distortion error. In this implementation, the power minimization loop controller 30 relies on the close tracking between the main and error paths (due to the use of matched and balanced components), to derive a measure of IMD distortion exclusively from the output of the carrier cancellation combiner W2. There is no feedback via distortion detection or correlation circuitry from the quadrature hybrid CPL2 to the power minimization loop controller 30. This enables the complexity and cost to be substantially reduced. Also both attenuators ATN1, ATN2 are controlled by the same control line 31, and both phase shifters PS1, PS2 are controlled by the same control line 32.

As will be appreciated from the foregoing description, by selectively combining the RF output of a main path RF power amplifier with the RF input signal supplied to a parallel path-installed RF power amplifier, that is matched to the main path amplifier, the predistortion control mechanism of the invention is able to predistort the RF input signal applied to the parallel amplifier so that it includes the same modulated RF carrier component as that applied to the main path amplifier, as well as a complementary version of the intermodulation component of the output of the main path amplifier. The predistortion for each amplifier is controlled such that the resulting RF output signals produced by the matched amplifier pair will have the desired RF carrier modulation component but equal amplitude and phase-reversed intermod components. Combining these two matched amplifier outputs in a quadrature hybrid produces a composite signal, in which the desired amplified modulated RF carrier components produced by each matched amplifier constructively sum to the intended amplification level, while unwanted IMD components destructively combine or cancel, leaving only the desired amplified modulated RF carrier.

In should also be noted that, in each of the embodiments of FIGS. 1 and 3, the variable phase shifter PS1 may be moved from the carrier cancellation path from the output of the main path RF power amplifier A1 and installed instead in the main path upstream of the power RF amplifier A1 together with the adjustable attenuator ATN1, to provide improved phase stability for the amplifier over time and temperature. As in the embodiment of FIG. 2, with such a transposition of the phase shifter PS1, the carrier cancellation path from the output 42 of the directional coupler CPL3 and the input 61 of the carrier cancellation combiner W2 may be adjusted by a variable gain setting attenuator GSET.

While we have shown and described several embodiments in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. An RF power amplifier arrangement comprising:
an RF input port to which an RF input signal is applied;
an RF output port from which an RF output signal is derived;
first and second RF signal processing paths coupled between said input and output ports and containing first and second matched RF power amplifiers having the same transfer function;
said first RF signal processing path including a first controlled RF signal vector modulator, that is controllably operative to adjust one or more parameters of a first RF input signal component applied to said first RF power amplifier;
said second RF signal processing path including a controlled RF signal vector modulator, that is controllably operative to adjust one or more parameters of a second RF input signal component applied to said second RF power amplifier, and an intermodulation distortion (IMD) extraction circuit coupled to an output of said first RF power amplifier and being operative to generate said second RF input signal component as a combination of said RF input signal and an IMD component present in an amplified RF output signal from said first RF power amplifier; and
an output signal combiner coupled to outputs of said first and second RF power amplifiers and said output port, and being operative to produce said RF output signal as a composite RF output signal, in which amplify RF carrier components produced by each of said first and second matched RF power amplifiers constructively sum and IMD components produced thereby destructively combine.

2. An RF power amplifier arrangement according to claim 1, wherein said IMD extraction circuit includes a cancellation combiner that is operative to differentially combine an amplified RF output signal produced by said first RF power amplifier with a portion of said RF input signal applied to said second signal processing path to derive said IMD component, and to combine said IMD component with said portion of said RF input signal applied to said second signal processing path, so as to derive said second RF input signal component as a combination of said RF input signal and said IMD component that is phase complementary to said RF input signal.

3. An RF power amplifier arrangement according to claim 2, further including a controller which is operative to control said first and second controlled RF signal predistorters in accordance with a measure of intermodulation distortion energy produced in at least one of said first and second RF power amplifiers.

4. An RF power amplifier arrangement according to claim 3, wherein said controller is operative to control said first and second controlled RF signal vector modulators in accordance with said IMD component derived by said cancellation combiner.

5. An RF power amplifier arrangement according to claim 1, further including a controller which is operative to control said first and second controlled RF signal vector modulators in accordance with a measure of intermodulation distortion energy produced in at least one of said first and second RF power amplifiers.

6. An RF power amplifier arrangement according to claim 5, further including an IMD distortion detector coupled to said output port and being operative to couple a measure of IMD distortion in said RF output signal to said controller.

7. An RF power amplifier arrangement according to claim 5, further including a correlator coupled to outputs of said first and second amplifiers and being operative to couple a measure of IMD distortion in said RF output signal to said controller.

8. An RF power amplifier arrangement according to claim 7, wherein said RF output signal combiner has a first RF output at which said RF carrier components produced by each of said first and second matched RF power amplifiers constructively sum and said IMD components produced thereby destructively combine, and a second RF output at which said RF carrier components produced by each of said first and second matched RF power amplifiers destructively combine, and said IMD components produced thereby constructively sum, and wherein said a correlator is coupled to said first and second RF outputs of said output signal combiner.

9. An RF power amplifier arrangement according to claim 1, wherein said controller is decoupled from said RF output port.

10. An RF power amplifier arrangement according to claim 1, wherein said first controlled RF signal predistorter is controllably operative to adjust the amplitude of said first RF input signal components applied to said first RF power amplifier, and further including a controlled phase shifter installed between said output of said first RF power amplifier and said IMD extraction circuit, and further including a controller which is operative to control said first controlled RF signal predistorter and said controlled phase shifter in accordance with a measure of intermodulation distortion energy produced in at least one of said first and second RF power amplifiers.

11. An RF power amplifier arrangement according to claim 1, wherein said first and second controlled RF signal vector modulators are controllably operative to adjust phase and amplitude of said first and second RF input signal components applied to said first and second RF power amplifiers, and further including a controller which is operative to control said first and said controlled RF signal predistorters in accordance with a measure of intermodulation distortion energy produced in at least one of said first and second RF power amplifiers.

12. An RF power amplifier arrangement according to claim 1, wherein said second RF signal processing path is operative to generate said second RF input signal to include the same RF carrier component applied to said first RF power amplifier, so that the amplified RF carrier component produced by said second matched RF power amplifier is the same as that produced by said first matched RF power amplifier, whereby said output signal produced by said output signal combiner includes a constructive summation of the same amplitude RF carrier components produced by said first and second matched RF power amplifiers.

13. An RF power amplifier arrangement according to claim 2, wherein said IMD extraction circuit further includes an adjustable attenuator, which is operative to controllably attenuate said portion of said RF input signal applied to said second signal processing path, so as to adjust the carrier-to-carrier intermodulation distortion ratio (C/I) at the output of said IMB extraction circuit, so as to simultaneously predistort the input to said second matched RF power amplifier and cancel distortion from said first matched RF power amplifier in said composite RF output signal.

14. An RF power amplifier arrangement comprising main and parallel RF signal processing paths coupled to an RF signal input port to which a modulated RF carrier signal is applied, said first main path including a main path predistortion circuit coupled to a main path RF power amplifier, said second parallel path including a parallel path predistortion circuit coupled to a parallel path RF power amplifier having a transfer function that is the same as that of said main path RF power amplifier, and an intermodulation distortion extraction circuit coupled to said main and parallel paths and being operative to extract an intermodulation distortion component present in an amplified RF output signal from said first RF power amplifier, and an RF signal processing path combiner that is operative to combine RF outputs of said main and parallel path amplifiers to produce a composite RF output signal in which amplified modulated RF carrier components produced by said main and parallel path RF amplifiers constructively sum and intermodulation distortion components produced thereby destructively combine.

15. An RF power amplifier arrangement according to claim 14, wherein said intermodulation distortion extraction circuit is operative to differentially combine an amplified RF output signal produced by said main path RF power amplifier with a portion of said modulated RF carrier signal to derive said intermodulation distortion component, and wherein said parallel signal processing path is configured to combine said intermodulation distortion component with a portion of said modulated RF carrier signal for application to said parallel path predistortion circuit.

16. An RF power amplifier arrangement according to claim 14, further including a controller which is operative to control said main path and parallel path vector modulator circuits in accordance with a measure of intermodulation distortion energy produced in at least one of said main and parallel path RF power amplifiers.

17. An RF power amplifier arrangement according to claim 14, further including a controller which is operative to control said main path and parallel path vector modulator circuits in accordance with said intermodulation distortion component.

18. An RF power amplifier arrangement according to claim 17, further including an intermodulation distortion component detector coupled to an output port of said RF signal processing path combiner and being operative to couple a measure of intermodulation distortion to said controller.

19. An RF power amplifier arrangement according to claim 17, further including a correlator coupled to outputs of said first and second amplifiers and being operative to couple a measure of intermodulation distortion to said controller.

20. An RF power amplifier arrangement according to claim 17, wherein said controller is decoupled from said RF output port.

21. An RF power amplifier arrangement according to claim 14, wherein said main path predistortion circuit is controllably operative to adjust the amplitude of a main path RF carrier signal applied to said main path RF power amplifier, and further including a controlled phase shifter installed between said output of said main path RF power amplifier and said intermodulation component extraction circuit, and further including a controller which is operative to control said main path predistortion circuit and said controlled phase shifter in accordance with a measure of intermodulation distortion energy produced in at least one of said main and parallel path RF power amplifiers.

22. An RF power amplifier arrangement according to claim 14, wherein said main path and parallel path predistortion circuits are controllably operative to adjust phase and amplitude of main path and parallel path modulated RF carrier signals applied to said main path and parallel path RF power amplifiers, and further including a controller which is operative to control said vector modulator circuits in accordance with a measure of intermodulation distortion energy produced in at least one of said main path and parallel path RF power amplifiers.

23. An RF power amplifier arrangement according to claim 14, wherein said parallel path predistortion circuit is operative to provide an RF input signal component to said second, parallel path RF amplifier that includes the same RF carrier component applied to said first, main path RF power amplifier, so that the amplified RF carrier component produced by said second, parallel path RF power amplifier is the same as that produced by said first, main path RF power amplifier, whereby the composite RF output signal produced by said RF signal processing path combiner includes a constructive summation of the same amplified RF carrier components produced by said first, main path and second, parallel path RF power amplifiers.

24. An RF power amplifier arrangement according to claim 15, wherein said intermodulation distortion extraction circuit further includes an adjustable attenuator, which is operative to controllably attenuate said portion of said modulated RF carrier signal applied to said second, parallel path predistortion circuit, so as to adjust the carrier-to-intermodulation distortion ratio (C/I) at the output of said intermodulation distortion extraction circuit, and thereby simultaneously predistort the RF component applied to said second, parallel path RF power amplifier and cancel distortion from said first, main path RF power amplifier in said composite RF output signal.

* * * * *